US006090532A

United States Patent [19]

West et al.

[11] Patent Number: 6,090,532

[45] Date of Patent: *Jul. 18, 2000

[54] POSITIVE-WORKING INFRARED RADIATION SENSITIVE COMPOSITION AND PRINTING PLATE AND IMAGING METHOD

[75] Inventors: Paul R. West, Ft. Collins; Jeffery A. Gurney, Greeley; Neil F. Haley, Wellington, all of Colo.

[73] Assignee: Kodak Polychrome Graphics LLC, Norwalk, Conn.

[ * ] Notice: This patent is subject to a terminal disclaimer.

[21] Appl. No.: 08/821,844

[22] Filed: Mar. 21, 1997

[51] Int. Cl.[7] .......... G03F 7/30

[52] U.S. Cl. .......... 430/326; 430/270.1; 430/271.1; 430/278.1; 430/944

[58] Field of Search .......... 430/270.1, 271.1, 430/278.1, 944, 326

[56] References Cited

U.S. PATENT DOCUMENTS

| | | | |
|---|---|---|---|
| 2,766,118 | 10/1956 | Sus et al. | 95/7 |
| 2,767,092 | 10/1956 | Schmidt | 95/7 |
| 2,772,972 | 12/1956 | Herrick, Jr. et al. | 96/33 |
| 2,859,112 | 11/1958 | Sus et al. | 96/91 |
| 2,907,665 | 10/1959 | Fraher | 106/49 |
| 3,046,110 | 7/1962 | Schmidt | 96/33 |
| 3,046,111 | 7/1962 | Schmidt | 96/33 |
| 3,046,115 | 7/1962 | Schmidt et al. | 96/33 |
| 3,046,118 | 7/1962 | Schmidt | 96/33 |
| 3,046,119 | 7/1962 | Sus | 96/33 |
| 3,046,120 | 7/1962 | Schmidt et al. | 96/33 |
| 3,046,121 | 7/1962 | Schmidt | 96/33 |
| 3,046,122 | 7/1962 | Sus | 96/33 |
| 3,046,123 | 7/1962 | Sus et al. | 96/33 |
| 3,061,430 | 10/1962 | Uhlig et al. | 96/33 |
| 3,102,809 | 9/1963 | Endermann et al. | 96/33 |
| 3,105,465 | 10/1963 | Peters | 122/37 |
| 3,628,953 | 12/1971 | Brinckman | 96/36.3 |
| 3,635,709 | 1/1972 | Kobayashi | 96/33 |
| 3,647,443 | 3/1972 | Rauner et al. | 96/33 |
| 3,837,860 | 9/1974 | Roos | 96/91 D |
| 3,859,099 | 1/1975 | Petropoulus et al. | 96/90 R |
| 3,891,439 | 6/1975 | Katz et al. | 96/49 |
| 3,902,906 | 9/1975 | Iwama et al. | 96/115 R |
| 4,063,949 | 12/1977 | Uhlig et al. | 96/27 |
| 4,306,010 | 12/1981 | Uehara et al. | 430/190 |
| 4,306,011 | 12/1981 | Uehara et al. | 430/190 |
| 4,308,368 | 12/1981 | Kubo et al. | 525/504 |
| 4,356,254 | 10/1982 | Takashi et al. | 430/296 |
| 4,493,884 | 1/1985 | Nagano et al. | 430/192 |
| 4,497,888 | 2/1985 | Nishioka et al. | 430/165 |
| 4,529,682 | 7/1985 | Toukhy | 430/190 |
| 4,544,627 | 10/1985 | Takashi | 430/325 |
| 4,576,901 | 3/1986 | Stahlhofen et al. | 430/325 |
| 4,609,615 | 9/1986 | Yamashita et al. | 430/325 |
| 4,684,599 | 8/1987 | Uhlig et al. | 96/27 |
| 4,693,958 | 9/1987 | Schwartz | 430/302 |
| 4,708,925 | 11/1987 | Newman | 430/270.1 |
| 4,789,619 | 12/1988 | Ruckert et al. | 430/270.1 |
| 4,927,741 | 5/1990 | Garth et al. | 430/309 |
| 4,966,798 | 10/1990 | Brosius et al. | 428/64 |
| 5,002,853 | 3/1991 | Aoai et al. | 430/281.1 |
| 5,085,972 | 2/1992 | Vogel | 430/270 |
| 5,130,223 | 7/1992 | Nishimura | 430/166 |
| 5,145,763 | 9/1992 | Bassett et al. | 430/169 |
| 5,149,613 | 9/1992 | Stahlhofen et al. | 430/296 |
| 5,200,292 | 4/1993 | Shinozaki et al. | 430/296 |
| 5,200,298 | 4/1993 | Takagi et al. | 430/264 |
| 5,202,221 | 4/1993 | Imai et al. | 430/283 |
| 5,208,135 | 5/1993 | Patel et al. | 430/281 |
| 5,227,473 | 7/1993 | Kawamura et al. | 534/557 |
| 5,279,918 | 1/1994 | Nishi et al. | 430/190 |
| 5,340,699 | 8/1994 | Haley et al. | 430/270.1 |
| 5,368,977 | 11/1994 | Yoda et al. | 430/190 |
| 5,372,907 | 12/1994 | Haley et al. | 430/157 |
| 5,372,915 | 12/1994 | Haley et al. | 430/302 |
| 5,372,917 | 12/1994 | Tsuchida et al. | 430/343 |
| 5,380,622 | 1/1995 | Roser | 430/343 |
| 5,437,952 | 8/1995 | Hirai et al. | 430/83 |
| 5,441,850 | 8/1995 | Marshall et al. | 430/336 |
| 5,466,557 | 11/1995 | Haley et al. | 430/278.1 |
| 5,631,119 | 5/1997 | Shinozaki | 430/326 |
| 5,641,608 | 6/1997 | Grunwald et al. | 430/302 |
| 5,658,708 | 8/1997 | Kondo | 430/288.1 |
| 5,705,308 | 1/1998 | West et al. | 430/165 |
| 5,705,309 | 1/1998 | West et al. | 430/167 |
| 5,705,322 | 1/1998 | West et al. | 430/325 |
| 5,725,994 | 3/1998 | Kondo | 430/270.1 |
| 5,731,123 | 3/1998 | Kawamura et al. | 430/176 |
| 5,741,619 | 4/1998 | Aoshima et al. | 430/175 |
| 5,759,742 | 6/1998 | West et al. | 430/278.1 |
| 5,786,125 | 7/1998 | Tsuchiya et al. | 430/272.1 |
| 5,840,467 | 11/1998 | Kitatani et al. | 430/302 |
| 5,858,626 | 1/1999 | Sheriff et al. | 430/326 |

FOREIGN PATENT DOCUMENTS

| | | |
|---|---|---|
| 0 304 313 | 2/1989 | European Pat. Off. . |
| 0 327 998 | 8/1989 | European Pat. Off. . |
| 0 343 986 | 11/1989 | European Pat. Off. . |
| 0 366 590 | 5/1990 | European Pat. Off. . |
| 0 375 838 | 7/1990 | European Pat. Off. . |
| 0 390 038 | 1/1991 | European Pat. Off. . |
| 0 410 606 | 1/1991 | European Pat. Off. . |
| 0 424 182 | 4/1991 | European Pat. Off. . |
| 0 458 485 | 11/1991 | European Pat. Off. . |
| 0 517 428 | 12/1992 | European Pat. Off. . |
| 0 519 128 | 12/1992 | European Pat. Off. . |

(List continued on next page.)

OTHER PUBLICATIONS

"The Chemical Behavior of Positive Working Systems" by J.C. Strieter. Eastman Kodak Company, Rochester, New York. pp 116–122.

*Primary Examiner*—John S. Chu
*Attorney, Agent, or Firm*—Ratner & Prestia

[57] ABSTRACT

A positive-working lithographic printing plate is used to provide a positive image without a post-exposure baking step and without any floodwise exposure steps. The printing plate includes a layer that is imageable using an infrared radiation laser. This layer consists essentially of a phenolic resin, an infrared radiation absorbing compound, and a dissolution inhibitor that is non-photosensitive and is capable of providing sites for hydrogen bonding with the phenolic moieties of the binder resin.

21 Claims, No Drawings

FOREIGN PATENT DOCUMENTS

| | | |
|---|---|---|
| 0 519 591 | 12/1992 | European Pat. Off. . |
| 0 534 324 | 3/1993 | European Pat. Off. . |
| 0 608 983 | 8/1994 | European Pat. Off. . |
| 0 672 954 A2 | 9/1995 | European Pat. Off. . |
| 0 691 575 | 1/1996 | European Pat. Off. . |
| 0 706 899 | 4/1996 | European Pat. Off. . |
| 0 720 057 | 7/1996 | European Pat. Off. . |
| 0 780 239 | 8/1996 | European Pat. Off. . |
| 0 803 771 | 10/1997 | European Pat. Off. . |
| 0 819 980 | 1/1998 | European Pat. Off. . |
| 0 839 647 | 5/1998 | European Pat. Off. . |
| 0 864 419 | 9/1998 | European Pat. Off. . |
| 0 867 278 | 9/1998 | European Pat. Off. . |
| 0 894 622 | 2/1999 | European Pat. Off. . |
| 4426820 | 7/1994 | Germany . |
| 207013 | 2/1995 | Japan . |
| 07120928 | 5/1995 | Japan . |
| 302722 | 5/1995 | Japan . |
| 9264 | 6/1995 | Japan . |
| 1066358 | 4/1967 | United Kingdom . |
| 1170495 | 11/1969 | United Kingdom . |
| 1231789 | 5/1971 | United Kingdom . |
| 1245924 | 9/1971 | United Kingdom . |
| 1546633 | 5/1979 | United Kingdom . |
| 1563829 | 4/1980 | United Kingdom . |
| 1603920 | 12/1981 | United Kingdom . |
| 2082339 | 3/1982 | United Kingdom . |
| 86/02743 | 5/1986 | WIPO . |
| 91/19227 | 12/1991 | WIPO . |
| 93/06528 | 4/1993 | WIPO . |
| 96/02491 | 2/1996 | WIPO . |
| 97/39894 | 4/1996 | WIPO . |
| 96/20429 | 7/1996 | WIPO . |

POSITIVE-WORKING INFRARED RADIATION SENSITIVE COMPOSITION AND PRINTING PLATE AND IMAGING METHOD

FIELD OF THE INVENTION

This invention relates to a positive-working imaging composition and printing plate that is sensitive to infrared radiation. It also relates to a method of forming a positive image using such printing plates.

BACKGROUND OF THE INVENTION

The art of lithographic printing is based upon the immiscibility of oil and water, wherein the oily material or ink is preferentially retained by the image areas and the water or fountain solution is preferentially retained by the nonimage areas. When a suitably prepared surface is moistened with water and an ink is then applied, the background or nonimage areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become hardened so that nonimage areas are removed in the developing process. Such a plate is referred to in the art as a negative-working printing plate. Conversely, when those portions of the coating that are exposed become soluble so that they are removed during development, the plate is referred to as a positive-working plate. In both instances, the coating remaining on the plate is ink-receptive or oleophilic and the nonimage areas or background are water-receptive or hydrophilic. The differentiation between image and nonimage areas is made in the exposure process where a film is applied to the plate with a vacuum to insure good contact. The plate is then exposed to a light source, a portion of which is composed of UV radiation. In the instance of positive-working plates, the areas on the film corresponding to the image areas are darkened, preventing light from making those plate coating areas developer soluble, while the areas on the film corresponding to the plate nonimage areas are clear, allowing them to become soluble. The solubilized plate image areas can be removed during development. The nonimage areas of a positive-working plate remain after development, are oleophilic and will accept ink while the exposed areas that have had the coating removed through the action of a developer are desensitized and are therefore hydrophilic.

Various useful printing plates that can be either negative-working or positive-working are described, for example, in GB 2,082,339 (Horsell Graphic Industries), and U.S. Pat. No. 4,927,741 (Garth et al), both of which describe imaging layers containing an o-diazoquinone and a resole resin, and optionally a novolac resin. Another plate that can be similarly used is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic transparency.

Printing plates comprising imaging layers that contain novolac resins, infrared radiation absorbing compounds and other materials are described, for example, in U.S. Pat. No. 5,340,699 (Haley et al), U.S. Pat. No. 5,372,907 (Haley et al), U.S. Pat. No. 5,372,917 (Haley et al), U.S. Pat. No. 5,466,557 (Haley et al) and EP-A-0 672 954 (Eastman Kodak). Imaging with these plates includes exposure to near-infrared energy to produce acids in an imagewise fashion. These acids catalyze crosslinking of the coating in a post-exposure heating step. Precise temperature control is required in the heating step.

DE-4,426,820 (Fuji) describes a printing plate that can be imaged in the near infrared at moderate power levels with relatively simple processing requirements. This printing plate has at least two layers: an imaging layer containing an o-diazoquinone compound and an infrared radiation absorbing compound, and a protective overcoat containing a water-soluble polymer or silicone polymer. This plate is floodwise exposed with ultraviolet light to convert the o-diazoquinone to an indenecarboxylic acid, which is then imagewise decarboxylated by means of heat transferred from the infrared radiation absorbing material. Development with an alkaline solution results in removal of areas not subjected to thermal decarboxylation. The pre-imaging floodwise exposure step, however, is awkward in that it precludes the direct loading of the printing plates into plate-setters.

U.S. Pat. No. 5,705,308 (West et al.) and U.S. Pat. No. 5,705,322 (West et al.) describe infra-red radiation-sensitive, negative-working printing plates having imaging layers containing novolac resins and diazonaphthoquinones. A UV flood-exposure step is required before processing these plates. Although the UV flood exposure step has considerably more latitude than the post-exposure baking step used with the plates noted above, it would be desirable to avoid additional steps between imaging and processing.

Optical recording media having laser imageable layers are described in U.S. Pat. No. 4,966,798 (Brosius et al). Such layers contain an infrared radiation absorbing dye or pigment in a phenolic resin, and are resident on a suitable polymeric support. Recordation is carried out using a laser to bring about a surface change in the imageable layer. Printing plates are different materials and require a different imaging process.

In copending and commonly assigned U.S. Ser. No. 08/822,376 of Sheriff et al positive-working printing plates are described that can be processed directly after imaging without any intervening baking or floor exposure steps. Such plates have a very simple imaging layer consisting essentially of a novolac resin and an infrared radiation (IR) absorbing compound in specific molar ratios.

However, there is a need to increase the processing latitude of these printing plates so that the development conditions need not be so carefully controlled in order to provide desired discrimination between image and nonimage areas. Processing latitude can be increased by incorporating diazonaphthoquinones, but in order to preserve the positive-working nature of such materials, the amount of the IR absorbing compounds must be restricted below certain threshold levels. The presence of diazonapthoquinones also makes such printing plates more sensitive to room light, negating one advantage of so-called "thermal" printing plates.

Thus, there is a need for simple printing plates that can be easily imaged in the near infrared at moderate power levels and that require relatively simple processing methods. It is also desired that such printing plates have improved processing latitude without the disadvantages presented by the use of diazonaphthoquinones.

SUMMARY OF THE INVENTION

The present invention provides a positive-working imaging composition consisting essentially of a phenolic binder resin, an infrared radiation absorbing compound, and a non-photosensitive compound capable of providing sites for hydrogen bonding with the phenolic moieties of the binder resin.

This invention also provides a positive-working lithographic printing plate comprising a support and having thereon an imaging layer formed from the imaging composition described above.

Still further, a method for providing a positive image consists essentially of the steps of:

A) imagewise exposing the positive-working lithographic printing plate described above with an infrared radiation emitting laser, and B) contacting the element with an aqueous developing solution to remove the image areas of the positive-working printing plate.

The printing plates of this invention are useful for providing high quality positive images using moderately powered lasers. Since the printing plates are infrared radiation sensitive, digital imaging information can be conveniently utilized to form continuous or halftone positive images. The printing plate is simple in construction, having only a single imaging layer that consists essentially of only three components: a phenolic binder resin, an IR absorbing compound, and a compound that is considered a "dissolution inhibitor". Such a compound inhibits the dissolution of the phenolic binder resin by providing hydrogen acceptor sites for hydrogen bonding with the phenolic moieties of the binder resin. This allows one to formulate the composition to optimize the amount of IR absorbing compound independently of its effect on the rate of resin dissolution.

After laser imaging, conventional development is the only other step needed to provide a positive image. No pre-imaging or post-imaging flood exposure, or post-imaging baking, step is necessary in the practice of this invention. There is greater flexibility in the selection of developer solutions and development times and temperatures. Moreover, the compounds used as dissolution inhibitors are non-photosensitive so the plates can be readily handled in room light.

DETAILED DESCRIPTION OF THE INVENTION

The phenolic binder resins useful in the practice of this invention include any alkali soluble resin having a reactive hydroxy group. The phenolic binder resins are light-stable, water-insoluble, alkali-soluble film-forming resins that have a multiplicity of hydroxy groups either on the backbone of the resin or on pendant groups. The resins typically have a molecular weight of at least about 350, and preferably of at least about 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" also includes, but is not limited to, what are known as novolac resins, resole resins and polyvinyl compounds having phenolic hydroxy groups. Novolac resins are preferred.

Novolac resins are generally polymers that are produced by the condensation reaction of phenols and an aldehyde, such as formaldehyde, or aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin, and pyrogallol-acetone resins. Such compounds are well known and described for example in U.S. Pat. No. 4,308,368 (Kubo et al), U.S. Pat. No. 4,845,008 (Nishioka et al), U.S. Pat. No. 5,437,952 (Hirai et al) and U.S. Pat. No. 5,491,046 (DeBoer et al), U.S. Pat. No. 5,143,816 (Mizutani et al) and GB 1,546,633 (Eastman Kodak). A particularly useful novolac resin is prepared by reacting m-cresol or phenol with formaldehyde using conventional conditions.

Phenolic resins that are known as "resole resins", including, for example, condensation products of bis-phenol A and formaldehyde, are also useful in this invention.

Still another useful phenolic binder resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above).

Other useful novolacs are described in U.S. Pat. No. 4,306,010 (Uehara et al) and U.S. Pat. No. 4,306,011 (Uehara et al). Still other useful phenolic resins are described in U.S. Pat. No. 5,368,977 (Yoda et al).

A mixture of the resins described above can be used, but preferably, a single novolac resin is present as the binder resin in the imaging composition of this invention.

When the imaging composition of this invention is formulated as a coating composition in suitable coating solvents, the binder resin is present in an amount of at least 0.5 weight percent (wet composition). Preferably, it is present in an amount of from about 1 to about 10 weight percent.

In the dried imaging layer of the printing plate, the binder resin is the predominant material. Generally, it comprises at least 50 weight percent, and more preferably from about 60 to about 88 weight percent, of the dried layer.

The second essential component of the imaging composition of this invention is an IR absorbing compound, or a mixture thereof. Such compounds typically have a maximum absorption wavelength ($\lambda_{max}$) in the region of at least about 700 nm, that is in the infrared and near infrared regions of the spectrum, and more particularly, within from about 800 to about 1100 nm. Particularly useful IR dyes are those having high extinction coefficients at wavelengths corresponding to the output of commercially available lasers (such as at 784 nm, 830 nm, 873 nm and 981 nm), Nd:YLF lasers (1053 nm) and ND:YAG lasers (1064 nm). Carbon black and other pigments, or dyes having broad spectral absorption characteristics are also useful as IR absorbing compounds. Mixtures of dyes, pigments, or dyes and pigments can also be used so that a given composition can be imaged at multiple wave lengths.

Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Particularly useful IR absorbing dyes are of the cyanine class. Other useful cyanine IR absorbing dyes are described in U.S. Pat. No. 4,973,572 (DeBoer), incorporated herein by reference.

The amount of IR absorbing compound in the dried imaging layer is generally sufficient to provide an optical density of at least 0.05 in the layer, and preferably, an optical density of from about 0.5 to about 2. This range would accommodate a wide variety of compounds having vastly different extinction coefficients. Generally, this is at least 0.1 weight percent, and preferably from 1 to 20 weight percent of the dry coating weight.

The weight ratio of the IR absorbing compound to phenolic binder resin is at least 1:1000, and preferably from about 1:200 to about 1:10. The optimum ratio will depend upon the phenolic binder resin and IR absorbing compound being used, and can be determined with routine experimentation.

One or more "dissolution inhibitor compounds" are present in the imaging composition of this invention as the third essential component. Such compounds have polar functionality that serve as acceptor sites for hydrogen bonding with hydroxy groups on aromatic rings. The acceptor sites are atoms with high electron density, preferably selected from electronegative first row elements. Useful polar groups include keto groups (including vinylogous esters). Other groups may also be useful, such as sulfones, sulfoxides, thiones, phosphine oxides, nitrites, imides, amides, thiols, ethers, alcohols, ureas as well as nitroso, azo, azoxy, nitro and halo groups. In general, it is desired that such compounds have an "inhibition factor" of at least about 0.5, and preferably at least about 5 and more preferably, at least about 15. The higher this value is, the more useful is the compound in this invention.

Inhibition factors for given compounds can be readily measured using the procedure described by Shih et al, *Macromolecules*, Vol. 27, p. 3330 (1994). The inhibition factor is the slope of the line obtained by plotting the log of the development rate as a function of inhibitor concentration in the phenolic resin coating. Development rates are conveniently measured by laser interferometry, as described by Meyerhofer in *IEEE Trans. Electron Devices*, ED-27, 921 (1980).

Representative compounds having the desired properties reported dissolution (inhibition factors listed in parentheses) include aromatic ketones including, but not limited to, xanthones (2.26), flavanones (6.80), flavones (18.3), 2,3-diphenyl-1-indenones (23.6), pyrones (including thiopyrones), and 1'-(2'-acetonaphthonyl)benzoate, and include such compounds as α- and β-naphthoflavone (49.1 and 46.6, respectively), 2,6-diphenyl-4H-pyran-4-one, 2,6-diphenylpyrone, 2,6-diphenylthiopyrone, 2,6-di-t-butylthiopyrone and 2,6-diphenyl-4H-thiopyran-4-one. The flavones and pyrones are preferred, including but not limited to, α-naphthoflavone, 2,6-diphenyl-4H-pyran-4-one and 2,6-diphenyl-4H-thiopyran-4-one.

The dissolution inhibitors useful in the present invention are not themselves actually sensitive to near-IR radiation. Their dissolution inhibition abilities are presumably altered by the localized heating that results from irradiation of the IR absorbing compound. Thus, by "non-photosensitive" is meant that these compounds are not significantly sensitive to actinic radiation having a wavelength above about 400 nm, and preferably above about 300 nm. Thus, the conventional photosensitive o-naphthoquinonediazides are not useful in this invention.

The weight ratio of the dissolution inhibitor compound to phenolic binder resin is at least about 1:100, and preferably from about 5:100 to about 40:100. The optimum weight ratio will depend upon the inhibition factor of the dissolution inhibitor compound, the phenolic resin binder, the amount and type of IR radiation absorbing compound, the amount and type of other addenda, and the developer composition used, and can be readily determined by routine experimentation by a skilled artisan. In the dry coating, the amount of dissolution inhibitor compound is generally at least about 1% (based on total dry weight).

Optional, non-essential components of the imaging composition of this invention include colorants, development accelerators, cross-linking agents, sensitizers, stabilizers, exposure indicators and surfactants in conventional amounts.

Obviously, the imaging composition is coated out of one or more suitable organic solvents that have no effect on the sensitivity of the composition, and in which all components are soluble or dispersible. Various solvents for this purpose are well known, but acetone and 1-methoxy-2-propanol are preferred. Mixtures can be used if desired. The essential components of the composition are dissolved in the solvents in suitable proportions to provide the desired dry amounts.

Suitable conditions for drying the imaging composition involve heating for a period of time of from about 0.5 to about 5 minutes at a temperature in the range of from about 20 to about 300° C.

To form a printing plate of this invention, the imaging composition is applied (usually by coating techniques) onto a suitable support, such as a metal sheet, polymeric film (such as a polyester), ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet, that can be further treated with an acrylamide-vinylphosphonic acid copolymer according to the teaching in U.S. Pat. No. 5,368,974 (Walls et al).

The thickness of the resulting positive-working imaging layer, after drying, on the support can vary widely, but typically it is in the range of from about 0.5 to about 2 $\mu$m, and preferably from about 1 to about 1.5 $\mu$m.

No other essential layers are provided on the printing plate. In particular, there are no protective or other type of layers over the imaging layer. Optional, but not preferred subbing or antihalation layers can be disposed under the imaging layer, or on the backside of the support (such as when the support is a transparent polymeric film).

The printing plates are uniquely adapted for "direct-to-plate" imaging applications. Such systems utilize digitized image information, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed printing plate. Thus, no exposed and processed films are needed for imaging of the plate, as in the conventional lithographic imaging processes.

Laser imaging can be carried out using any moderate or high-intensity laser writing device. Specifically, a laser printing apparatus is provided that includes a mechanism for scanning the write beam across the element to generate an image without ablation. The intensity of the write beam generated at the laser diode source at the printing plate is at least about 0.2 mW/$\mu^2$. During operation, the plate to be exposed is placed in the retaining mechanism of the writing device and the write beam is scanned across the plate to generate an image.

Following laser imaging, the printing plate of this invention is then developed in an alkaline developer solution until the image areas are removed to provide the desired positive image. Development can be carried out under conventional conditions for from about 30 to about 120 seconds. One useful aqueous alkaline developer solution is a silicate solution containing an alkali metal silicate or metasilicate. Such a developer solution can be obtained from Eastman Kodak Company as KODAK Production Series Machine Developer/Positive.

After development, the element can be treated with a finisher such as gum arabic, if desired. However, no other essential steps besides development in needed. Thus, no post-imaging bake step is carried out, nor is floodwise exposure needed before or after imaging.

The following examples are provided to illustrate the practice of this invention, and not to limit it in any manner. Unless otherwise noted, all percentages are by weight.

EXAMPLES 1–3

Four imaging coating formulations were prepared as shown in the following TABLE I:

TABLE I

| | PARTS BY WEIGHT | | | |
|---|---|---|---|---|
| COMPONENT | Example 1 | Example 2 | Example 3 | Control A |
| Cresol-formaldehyde novolak resin | 5.206 | 5.206 | 5.206 | 5.206 |
| CG-21-1005 dye (Ciba Geigy) | 0.108 | 0.108 | 0.108 | 0.108 |
| 2-[2-[2-Chloro-3-[(1,3-dihydro-1,1,3-trimethyl -2H-benz [e] indol-2-ylidene) ethylidene-1-cyclohexen-1-yl]-ethenyl]-1,1,3-tri-methyl-1H-benz [e] in-dolium, salt with 4-methylbenzenesulfonic acid as IR dye | 0.065 | 0.065 | 0.065 | 0.065 |
| 1'-(2'-Acetonaph-thonyl)-benzoate dissolution inhibitor | 0.924 | 0 | 0 | 0 |
| 2,3-Diphenyl-1-indenone dissolution inhibitor | 0 | 0.898 | 0 | 0 |
| α-Naphthoflavone dissolution inhibitor | 0 | 0 | 0.868 | 0 |
| BYK-307* | 0.011 | 0.011 | 0.011 | 0.011 |
| Acetone | 6.626 | 6.626 | 6.626 | 6.626 |
| 1-Methoxy-2-propanol | 87.060 | 87.086 | 87.116 | 87.984 |

*BYK-307 is a polyether-modified polydimethylsiloxane available from BYK-Chemie.

In Examples 1–3, the dissolution inhibitors were used in equimolar proportions, but no dissolution inhibitor was included in the Control A formulation.

Each formulation was applied to give a dry coating weight of about 1.5 g/m$^2$ onto electrochemically grained and sulfuric acid anodized aluminum supports that had been further treated with an acrylamide-vinylphosphonic acid copolymer (according to U.S. Pat. No. 5,368,974, noted above) to form an imaging layer in an unexposed lithographic printing plate.

A specific region or area of each plate was imaged on a commercially available EKTRON platesetter at 300 rpm and 250 milliwatts with a laser emitting a modulated pulse centered at 830 nm. A region or area of each plate was left unexposed (nonimaged). The plates were then processed with KODAK Production Series Machine Developer/Positive for various time intervals to provide positive images. The optical density of each plate was then measured in both the imaged and nonimaged areas. The "percent remaining coating" was estimated as follows:

$$\%\ \text{Coating Remaining} = 100 \times \frac{(\text{Processed density} - \text{Background})}{(\text{Original density} - \text{Background})}$$

wherein "Background" refers to the density of the uncoated plate support. The results are shown in TABLE II below. These results indicate that in the absence of a dissolution inhibitor, the imaging layer of the Control A plate was completely stripped from the support by the developer solution even with short development times.

All of the plates of the present invention, however, exhibited acceptable results, that is, significant differences in the amount of imaging layer remaining in the nonimaged areas in comparison with the imaged areas.

TABLE II

| | % Coating Remaining | | | | | | | | | |
|---|---|---|---|---|---|---|---|---|---|---|
| | Development Time | | | | | | | | | |
| | 5 seconds | | 10 seconds | | 20 seconds | | 40 seconds | | 80 seconds | |
| Plate | Exposed | Unexposed | Exposed | Unexposed | Exposed | Unexposed | Exposed | Unexposed | Exposed | Unexposed |
| Example 1 | 62% | 94% | 29% | 87% | 3% | 73% | 0% | 34% | 0% | 0% |
| Example 2 | 74% | 96% | 56% | 93% | 22% | 85% | 2% | 67% | 0% | 20% |
| Example 3 | 73 | 99% | 35% | 99% | 12% | 97% | 3% | 92% | 0% | 74% |
| Control A | 0% | 0% | 0% | 0% | 0% | 0% | 0% | 0% | 0% | 0% |

EXAMPLES 4–6

The formulations shown in TABLE III below were used to prepare printing plates of the present invention:

TABLE III

| | PARTS BY WEIGHT | | |
|---|---|---|---|
| COMPONENT | Example 4 | Example 5 | Example 6 |
| Cresol-formaldehyde novolak resin | 4.940 | 4.940 | 4.940 |
| CG-21-1005 dye (Ciba Geigy) | 0.100 | 0.100 | 0.100 |
| 2-[2-[2-Chloro-3-[(1,3-dihydro-1,1,3-trimethyl -2H-benz [e] indol-2-ylidene) ethylidene-1-cyclohexen-1-yl]-ethenyl]-1,1,3-tri-methyl-1H-benz [e] in-dolium, salt with 4-methylbenzene-sulfonic acid as IR dye | 0.065 | 0 | 0 |
| CYASORB** 165 | 0 | 0.434 | 0 |
| Carbon black (8%) dispersion in toluene | 0 | 0 | 5.383 |
| α-Naphthoflavone dissolution inhibitor | 1.085 | 0.868 | 0.651 |
| BYK-307 | 0.011 | 0.011 | 0.011 |
| Acetone | 6.288 | 6.288 | 6.288 |
| 1-Methoxy-2-propanol | 87.511 | 87.359 | 82.627 |

**CYASORB 165 is a dye commercially available from American Cyanamid.

Each of the printing plates was laser imaged (100 rpm/250 m Watts) and developed as described in Examples 1–3 , to provide high resolution positive images. All three showed essentially no coating loss in the nonimaged areas of the imaging layers.

Printing plates were also prepared from the formulations of Examples 5 and 6, and imaged at 1064 nm on a commercially available Gerber 42/T platesetter, and similarly processed to provide high resolution positive images. The development conditions were not quite sufficient to completely clear the background (nonimaged areas) for the Example 5 plate.

Comparison Examples

The formulations shown in TABLE IV below were similarly used to prepare printing plates that are outside this invention because of a photosensitive dissolution inhibitor used:

TABLE IV

| | PARTS BY WEIGHT | |
|---|---|---|
| COMPONENT | Control B | Control C |
| Cresol-formaldehyde novolak resin | 5.206 | 5.206 |
| CG-21-1005 dye (Ciba Geigy) | 0.108 | 0.108 |
| 2-[2-[2-Chloro-3-[(1,3-dihydro-1,1,3-trimethyl-2H-benz [e] indol-2-ylidene) ethylidene-1-cyclohexen-1-yl]-ethenyl]-1,1,3-tri-methyl-1H-benz [e] in-dolium, salt with 4-methylbenzene-sulfonic acid as IR dye | 0.065 | 0.065 |
| 2,4-Bis(1,2-naphthoquinone-2-diazido-5-sulfonyloxy) benzophenone dissolution inhibitor | 2.009 | 0.868 |
| BYK-307 | 0.011 | 0.011 |
| Acetone | 6.626 | 6.626 |
| 1-Methoxy-2-propanol | 85.975 | 87.116 |

The printing plates were imaged and processed as described in Examples 1–3 above. The imaged and nonimaged normalized thicknesses were calculated as in those examples, and the results of percent coating remaining for different development times are summarized in the following TABLE V. The dissolution inhibitor used in the Control B plate was a photosensitive compound based on diazonaphtho-quinone chemistry, and was present at the same molar concentration as the dissolution inhibitor of Example 1. The nonimaged area thickness loss was very low, as desired, but the exposed areas were not completely cleared even at the longest development time. The amount of dissolution inhibitor was decreased for Control C, providing improved development cleanout, but the nonimaged areas coating loss was unacceptable.

TABLE V

| | 5 seconds | | 10 seconds | | 20 seconds | | 40 seconds | | 80 seconds | |
|---|---|---|---|---|---|---|---|---|---|---|
| Coating | Exposed | Unexposed | Exposed | Unexposed | Exposed | Unexposed | Exposed | Unexposed | Exposed | Unexposed |
| Control B | 83% | 99% | 74% | 98% | 62% | 99% | 34% | 97% | 7% | 90% |
| Control C | 14% | 87% | 1% | 70% | 0% | 30% | 0% | 0% | 0% | 0% |

EXAMPLE 7

Example 3 was repeated, but substituting 2,6-diphenylpyrone for the naphthoflavone as the dissolution inhibitor compound. TABLE VI below shows that excellent differences in dissolution rates were obtained between the imaged and non-imaged areas.

EXAMPLE 8

Example 3 was repeated, but substituting 2,6-diphenylthiopyrone for the naphthoflavone as the dissolution inhibitor compound. TABLE VI below shows that excellent differences in dissolution rates were obtained between the imaged and non-imaged areas.

EXAMPLE 9

Example 3 was repeated, but substituting 2,6-di-t-butylthiopyrone for the naphthoflavone as the dissolution inhibitor compound. TABLE VI below shows that acceptable differences in dissolution rates were obtained between the imaged and non-imaged areas.

TABLE VI

% Coating Remaining vs. development time for Examples 7–9

| | Development Time | | | | | | | | | |
|---|---|---|---|---|---|---|---|---|---|---|
| | 5 seconds | | 10 seconds | | 20 seconds | | 40 seconds | | 80 seconds | |
| Plate | Exposed | Unexposed | Exposed | Unexposed | Exposed | Unexposed | Exposed | Unexposed | Exposed | Unexposed |
| Example 7 | 88% | 99% | 80% | 100% | 65% | 96% | 36% | 96% | 7% | 90% |
| Example 8 | — | — | 81% | 96% | 74% | 96% | 55% | 100% | 17% | 98% |
| Example 9 | 84% | 100% | 73% | 95% | 51% | 93% | 19% | 84% | 4% | 69% |

The invention has been described in detail with particular reference to preferred embodiments thereof, but it will be understood that variations and modifications can be effected within the spirit and scope of the invention.

We claim:

1. A method for providing a positive image, the method consisting essentially of the steps of:

A) imagewise exposing a laser-imageable, positive-working imaging layer of a photosensitive element with infrared radiation to produce an exposed layer comprising imaged areas;

B) contacting the exposed layer with an aqueous alkaline developing solution to remove the imaged areas and form the positive image; and C) optionally, treating the element with a finisher; in which:

the photosensitive element comprises a support having thereon the laser-imageable, positive-working imaging layer;

the laser-imageable, positive-working imaging layer comprises:

i) a phenolic resin comprising phenolic moieties, ii) an infrared radiation absorbing compound, and iii) a non-photosensitive compound capable of providing sites for hydrogen bonding with the phenolic moieties of the phenolic resin.

2. The method of claim 1 carried out without a post-imaging bake step and without a floodwise exposure, either before or after imaging.

3. The method of claim 1 in which the phenolic resin is a novolac resin.

4. The method of claim 1 in which the phenolic resin is a is a cresol-formaldehyde resin.

5. The method of claim 1 in which the non-photosensitive compound is a xanthone, flavanone, flavone, pyrone, 2,3-diphenyl-1-indenone, or 1'-(2'-acetonaphthonyl)benzoate.

6. The method of claim 5 in which the phenolic resin is a novolac resin.

7. The method of claim 6 in which the non-photosensitive compound is α-naphthoflavone, 6-diphenyl-4H-pyran-4-one or 2,6-diphenyl-4H-thiopyran-4-one.

8. The method of claim 7 carried out without a post-imaging bake step and without a floodwise exposure, either before or after imaging.

9. The method of claim 7 in which the element is treated with a finisher after step B).

10. The method of claim 1 in which the non-photosensitive compound is a dissolution inhibitor comprising a keto group, and the dissolution inhibitor has an inhibition factor of at least about 0.5.

11. The method of claim 10 in which the dissolution inhibitor has an inhibition factor of at least 15.

12. The method of claim 10 in which the phenolic resin is about 60 to about 88 weight percent of the imaging layer, the infra-red absorbing compound is 1 to 20 weight percent of the imaging layer, and the weight ratio of the dissolution inhibitor to the phenolic resin is from about 5:100 to about 40:100.

13. The method of claim 12 in which the infrared radiation absorbing compound is carbon black, or a squarylium, croconate, cyanine, merocyanine, indolizine, pyrylium or metal dithiolene dye or pigment that absorbs infrared radiation at a wavelength of from about 800 to about 1100 nm.

14. The method of claim 1 in which the infrared radiation absorbing compound is carbon black, or a squarylium, croconate, cyanine, merocyanine, indolizine, pyrylium or metal dithiolene dye or pigment that absorbs infrared radiation at a wavelength of from about 800 to about 1100 nm.

15. The method of claim 14 in which the phenolic resin is a novolac resin.

16. The method of claim 15 in which the non-photosensitive compound is a xanthone, flavanone, flavone, pyrone, 2,3-diphenyl-1-indenone, or 1'-(2'-acetonaphthonyl) benzoate.

17. The method of claim 16 in which the laser-imageable, positive-working imaging layer is the sole radiation-sensitive layer of the photosensitive element.

18. The method of claim 17 in which the non-photosensitive compound is a dissolution inhibitor comprising a keto group, and the dissolution inhibitor has an inhibition factor of at least about 15.

19. The method of claim 18 in which the phenolic resin is about 60 to about 88 weight percent of the imaging layer, the infra-red absorbing compound is 1 to 20 weight percent of the imaging layer, and the weight ratio of the dissolution inhibitor to the phenolic resin is from about 5:100 about 40:100.

20. The method of claim 19 carried out without a post-imaging bake step and without a floodwise exposure, either before or after imaging.

21. The method of claim 1 in which the laser-imageable, positive-working imaging layer is imaged with an infrared emitting laser.

* * * * *